United States Patent [19]
Groen

[11] Patent Number: 5,810,727
[45] Date of Patent: Sep. 22, 1998

[54] METHOD OF AND DEVICE FOR THE IMAGING OF OBJECTS BY MEANS OF MAGNETIC RESONANCE

[75] Inventor: Johannes P. Groen, Eindhoven, Netherlands

[73] Assignee: U.S. Philips Corporation, New York, N.Y.

[21] Appl. No.: 819,229

[22] Filed: Mar. 17, 1997

[30] Foreign Application Priority Data

Apr. 24, 1996 [EP] European Pat. Off. .............. 96201103

[51] Int. Cl.⁶ ........................................................ A61B 5/05
[52] U.S. Cl. ............................ 600/410; 324/307; 324/309
[58] Field of Search .................................... 600/410, 413, 600/419; 324/307, 309

[56] References Cited

U.S. PATENT DOCUMENTS

4,707,660  11/1987  Cuppen et al. ......................... 324/309

Primary Examiner—Marvin M. Lateef
Assistant Examiner—Eleni Mantis Mercader
Attorney, Agent, or Firm—Jack D. Slobod

[57] ABSTRACT

In a magnetic resonance method for imaging a part of a body which is arranged in a steady magnetic field, magnetic resonance signals are measured utilizing an initial read gradient and an alternating read gradient. The method can be used, for example for phase contrast angiography and for flow velocity measurements in a body of a patient. In order to counteract artifacts in the image due to inhomogeneities of the steady magnetic field, the time elapsing between an excitation RF pulse exciting spins in the part of the body and the initial read gradient is varied in successive pulse sequences. However, this causes artifacts in the fluid flow images due to the phase error which itself is caused by the spins flowing in the direction of the gradient field. In order to counteract these artifacts, the first-order moment of the initial read gradient and a first order lobe of the alternating read gradient is kept substantially constant in each pulse sequence.

20 Claims, 6 Drawing Sheets

METHOD OF AND DEVICE FOR THE IMAGING OF OBJECTS BY MEANS OF MAGNETIC RESONANCE

BACKGROUND OF THE INVENTION

1. Field of the Invention

The invention relates to a method of imaging a part of a body, arranged in a steady magnetic field, by means of magnetic resonance, in which method a measuring cycle is repeated at least twice, which measuring cycle includes:

a. generating an excitation RF pulse in order to excite spins in the part of the body, b. applying a read gradient to the steady magnetic field and sampling magnetic resonance signals, the read gradient and the application of further gradients providing sampling at instants which correspond to points of lines in a k-space which form part of a predetermined set of lines in the k-space, the gradients being applied differently per measuring cycle so that magnetic resonance signals are sampled on substantially all lines of the set.

The invention also relates to an MR device for carrying out a method of imaging objects by means of magnetic resonance.

2. Description of the Related Art

A method of this kind is known from WO 93/01509. According to the known method, subsequent to an excitation RF pulse there is generated a magnetic resonance signal, signal values thereof being measured for which it holds that the integral of the gradient over an interval from the excitation RF pulse until the sampling instants corresponds to points on lines in the k-space. When the signal values have been sampled with the sampling instants or sampling points corresponding to points of a large number of lines of the set, an image of a part of a patient is derived by way of transformation. The known method is used inter alia to image tissue and fluid flows in a part of a body of the patient, for example blood or cerebrospinal fluid (CSF). The known method can also be used for phase contrast angiography and for the measurement of flow speeds in blood vessels. In order to counteract echo artefacts in the image, according to the known method the instant at which the read gradient commences during the measurement of the magnetic resonance signal is varied so that a continuous linear phase error occurs in the k-space in the measured signal values and the image is distorted only slightly. It is a drawback of this known method that artefacts are liable to occur in the image of fluid flows in the object, for example echo images of the fluid flows.

SUMMARY OF THE INVENTION

It is inter alia an object of the invention to provide a method which counteracts such artefacts in the flow image. To this end, the method according to the invention is characterized in that per measuring cycle a time interval between the excitation RF pulse and the read gradient is varied and that per measuring cycle a first-order moment of the read gradient is kept substantially constant. Because the first-order moment of the read gradient is kept substantially constant during the measurement of successive excitations with different time shifts, the phase variation of the spins in the fluid flow due to the first-order moment is substantially constant in the vicinity of $k_y=0$ and motional artefacts caused by the phase variations of the spins of fluid flows during successive excitations are counteracted.

A special version of the method according to the invention is characterized in that the read gradient includes an initial read gradient and an alternating read gradient in a positive and a negative direction, a first integral of the initial read gradient over an interval equal to the duration of the initial read gradient being equal to substantially half a second integral of the alternating read gradient over an interval equal to the duration of a first lobe of the read gradient, the sign of the first integral opposing the sign of the second integral and the period of time between the initial read gradient and the center of the first lobe of the alternating read gradient being kept constant. It is thus achieved that the first-order moment of the read gradient is constant, that the phase variation of the spins in a fluid flow is constant, and that motional artefacts of liquid flows are counteracted in the image.

A further version of the method according to the invention is characterized in that subsequent to the excitation RF pulse and prior to the application of the read gradient there is generated a bipolar gradient pair whose direction extends parallel to the read gradient. This step achieves a first-order flow compensation for either the odd or the even gradient echo signals, because the contribution to the phase of said gradient echo signals due to the flow can be adjusted to practically zero. Another possibility is to adjust the mean phase error due to the flow to substantially zero for even and odd gradient echo signals. This is achieved by using the bipolar gradient pair with a first-order moment which opposes the moment to be compensated of the initial read gradient and the alternating read gradient.

A further version of the method according to the invention is characterized in that subsequent to the excitation RF pulse and prior to the application of an initial phase encoding gradient, having a direction extending transversely of the read gradient, there is generated a bipolar gradient pair whose direction extends parallel to the initial phase encoding gradient. This step achieves a flow compensation for the phase encoding direction, so that echo and displacement artefacts in images with a fluid flow directed obliquely to the direction of the read gradient and the initial phase encoding gradient are counteracted.

A further version of the invention is characterized in that subsequent to the excitation RF pulse there is generated at least one refocusing RF pulse, after which the read gradient is applied and the signal values are measured. The advantage of this step resides in the fact that in a refocused magnetic resonance signal more time is available for the measurement of signal values than in the free induction decay signal directly succeeding the excitation RF pulse. Moreover, the effect of inhomogeneities in the static magnetic field is less when a refocusing RF pulse is used. Pulse sequences containing a single excitation RF pulse succeeded by no or only one refocusing RF pulse and an alternating read gradient, are known as echo planar imaging (EPI) pulse sequences. A larger number of refocusing RF pulses is also feasible. Another magnetic resonance imaging technique which utilizes pulse sequences including an excitation RF pulse, a multitude of refocusing RF pulses and a multitude of read gradients for generating magnetic resonance signals is known as a "gradient and spin echo" (GRASE) technique. If necessary, several GRASE pulse sequences are repeated for the measurement of the part of the k-space to be measured. This imaging technique is known from the cited Patent Application WO/93/01509. According to this known imaging technique, the magnetic resonance signal is sampled after each refocusing RF pulse, the sampling points being situated on different lines in the k-space.

A further version of the method according to the invention is characterized in that the same points of the k-space are measured twice, using an opposed read gradient, after which an image is derived from signal values measured. By measuring two signal values of the same or substantially the same points in the k-space, be it with opposed read gradients, and deriving an image from the signal values measured it is achieved that ghost artefacts are counteracted.

Another version of the method according to the invention is characterized in that additional lines are inserted between the lines of the predetermined set and that the read gradient is applied in such a manner that the sign of its direction is reversed every line. As a result of this step, after reconstruction of the image from the measured signal values, a part of the reconstructed image will be free from ghost artefacts.

The invention also relates to a device for imaging by means of magnetic resonance, which device is arranged to carry out the described method. Such a device according to the invention is characterized in that the control unit is also arranged in such a manner that per measuring cycle a time interval between the excitation RF pulse and the read gradient is varied and that per measuring cycle a first-order moment of the read gradient is kept substantially constant. These and other, more detailed aspects of the invention will be described and elucidated hereinafter, by way of example, with reference to the drawings.

DETAILED DESCRIPTION OF THE PREFERRED EMBODIMENTS

Figure 1:
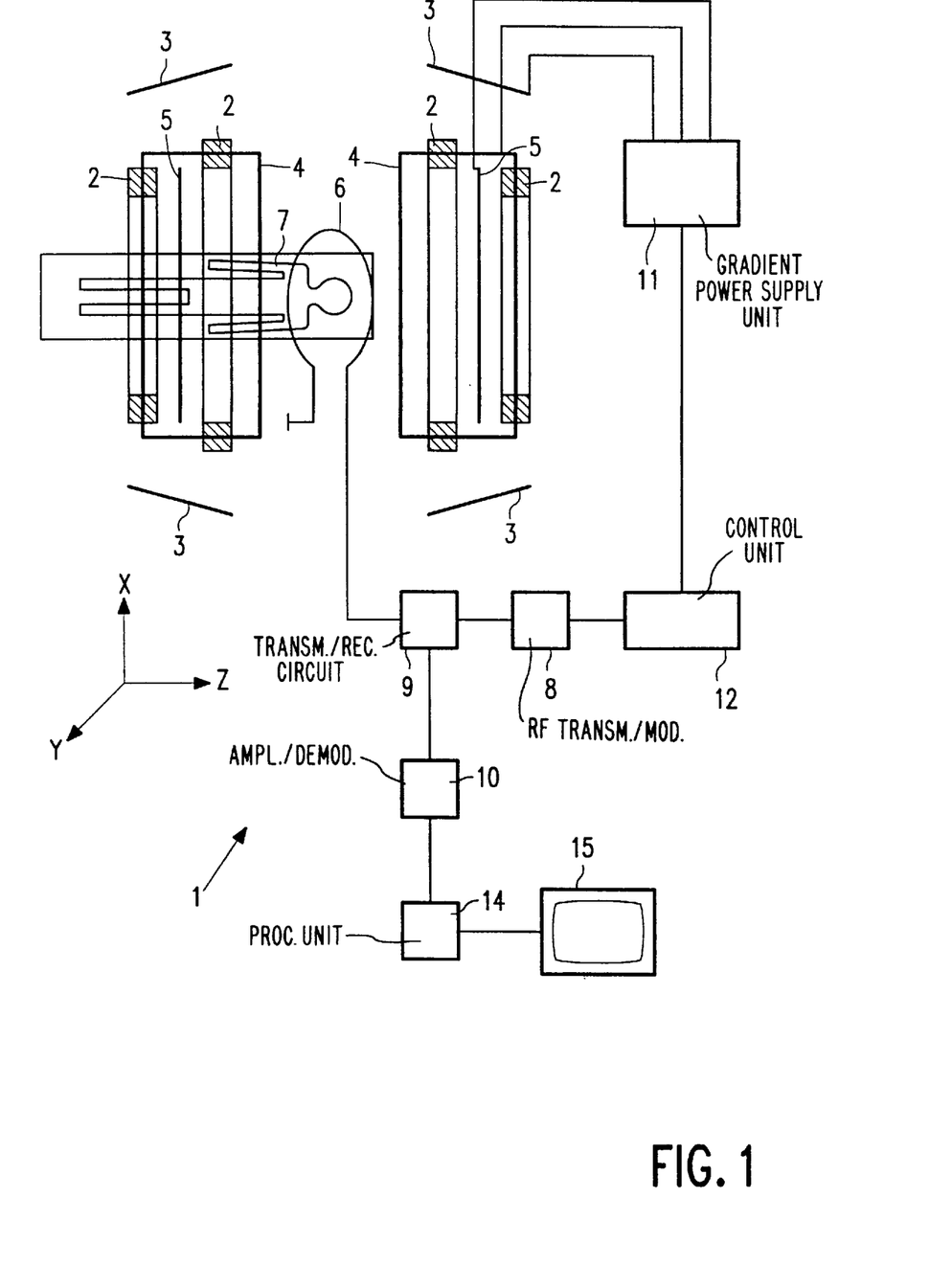
FIG. 1 shows an MR device for the imaging of objects.

FIG. 1 shows a magnetic resonance device which includes a first magnet system 2 for generating a steady, magnetic field and also various gradient coils 3, 4, 5 for generating additional magnetic fields having a gradient in the X, Y, Z directions. The Z-direction of the coordinate system shown corresponds by convention to the direction of the static magnetic field in the magnet system 2. The measuring coordinate system x, y, z to be used can be chosen independently of the X, Y, Z system shown in FIG. 1. The gradient coils 3, 4, 5 are fed by the power supply unit 11. An RF transmitter coil 6 serves to generate RF magnetic fields and is connected to an RF transmitter and modulator 8. A receiver coil is used to receive the magnetic resonance signal generated by the RF field in the object 7 to be examined, for example a patient. This may be the same coil as the RF transmitter coil 6. The magnet system 2 also encloses an examination space which is large enough to accommodate the patient 7 to be examined. The RF transmitter coil 6 is arranged around a part of the patient 7 within the examination space. The RF transmitter coil 6 is connected to a signal amplifier and demodulation unit 10 via a transmitter-receiver circuit 9. The control unit 12 controls a modulator 8 for the RF transmitter and the power supply unit 11 in order to generate special pulse sequences which include RF pulses and magnetic gradient fields. The phase and amplitude obtained from the demodulation unit 10 are applied to a processing unit 14. The processing unit 14 processes the signals received so as to form an image by transformation. This image can be visualized, for example by means of a monitor 15. A detailed description of magnetic resonance images and magnetic resonance devices can be found in the book "Practical NMR Imaging", by M. A Foster and J. M. S. Hutchison, 1987, IRL Press.

Figure 2:
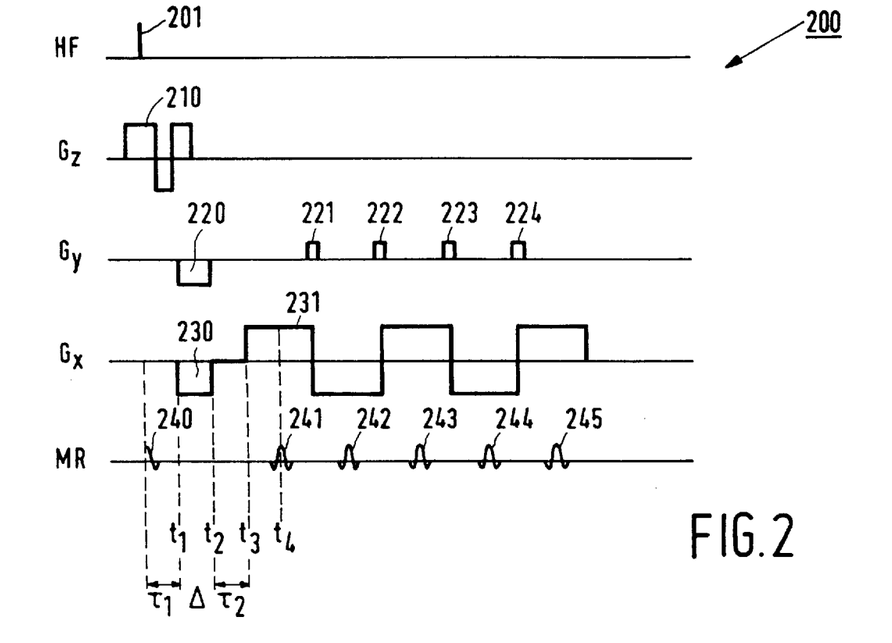
FIG. 2 shows a known multiple EPI pulse sequence.

The invention relates inter alia to a known multiple echo planar pulse sequence (multi-shot EPI) for generating magnetic resonance signals. The known pulse sequence is used in, for example a two-dimensional Fourier imaging technique. FIG. 2 shows a pulse sequence 200 of the known multiple EPI method. The EPI pulse sequence 200 commences with an excitation RF pulse 201 having a flip angle $\alpha$, indicated on the row HF in FIG. 2, simultaneously with a temporary magnetic field 210 having a gradient in the z direction, indicated on the row $G_z$. The flip angle $\alpha$ is, for example 90°. The excitation RF pulse 201 generates a first magnetic resonance signal 240 in a slice extending perpendicularly to the z-direction. In FIG. 2 this magnetic resonance signal is indicated in the row MR. Subsequently, at the instant $t_1$ a dephasing temporary magnetic field 230 is applied with a gradient oriented in the negative x direction. Consequently, the first magnetic resonance signal 240 quickly decays due to the dephasing of the individual spins. At the instant $t_3$ an alternating temporary magnetic field 231 is applied, the gradient being oriented alternately in the positive and the negative direction. This alternating temporary magnetic field 231 will be referred to hereinafter as the alternating read gradient. The dephasing temporary magnetic field 230 is referred to as the initial read gradient. The duration of the initial read gradient is denoted by the symbol $\Delta$. Because of the applied alternating temporary magnetic field 231, the direction of the individual spins is reversed. Consequently, the dephasing is converted into rephasing, a gradient echo signal 241 appearing at the instant $t_4$, followed by dephasing again. The part of the pulse sequence of the alternating read gradient between two polarity reversals is referred to as a lobe of the read gradient. The integral of the alternating read gradient over the time interval which is equal to the duration of this lobe equals minus twice the integral of the initial read gradient over the duration $\Delta$. Each subsequent lobe causes a further gradient echo signal, thus giving rise to a series of gradient echo signals 241, 242, 243, 244, 245. In practice, for example five gradient echo signals are generated during a single EPI pulse sequence. During application of the initial read gradient 230 a temporary magnetic field 220, having a gradient in the y-direction, is also applied so as to provide phase encoding in the magnetic resonance signal. This temporary magnetic field 220 is referred to as the initial phase encoding gradient. Upon reversal of the polarity of the read gradient there is furthermore applied a phase encoding gradient pulse (blip) 221, 222, 223, 224, thus yielding the measured signal values of the gradient echo signals 241, 242, 243, 244, 245 corresponding to sampling points which are situated on lines regularly distributed in part of the k-space to be sampled and extend parallel to the $k_x$ axis. After each phase encoding gradient pulse there being generated a gradient echo signal whose measured signal values correspond to a next line. Due to the selection of different initial phase encoding gradients in the multi-shot EPI method, in successive EPI pulse sequences the measuring values are measured whose sampling points are situated on a large number of lines in the k-space.

Figure 3:
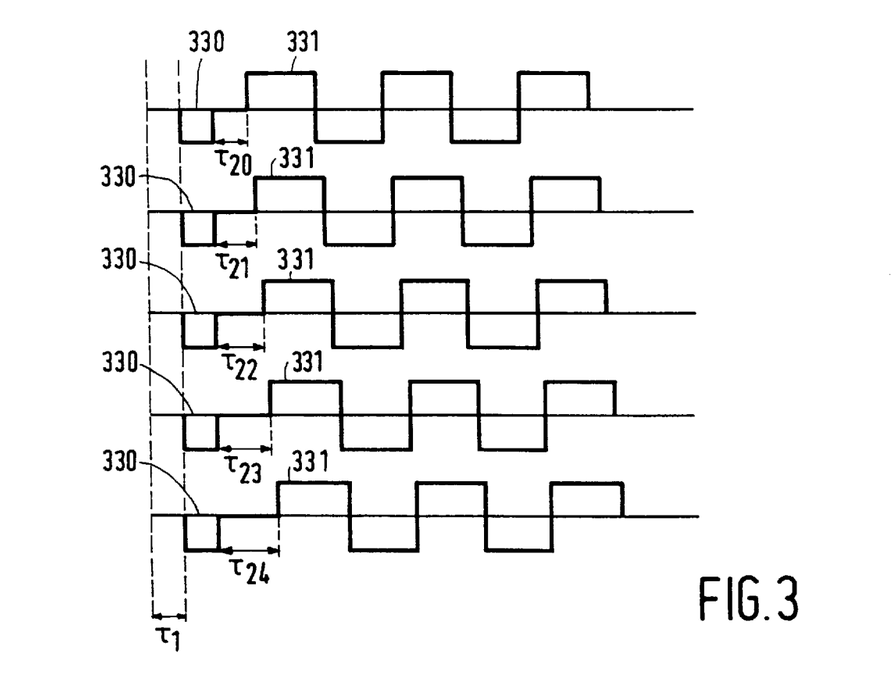
FIG. 3 shows the known time shifting in the multiple EPI pulse sequence.
Figure 4A:
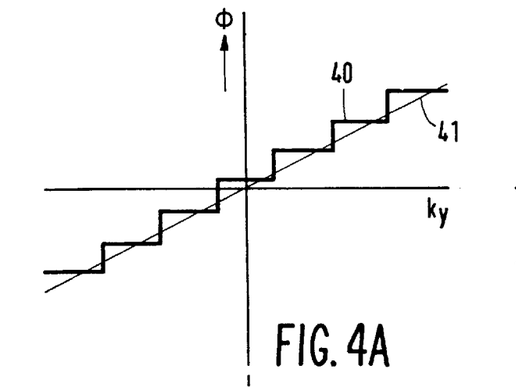
FIG. 4 shows the phase correction by time shifting.
Figure 4B:
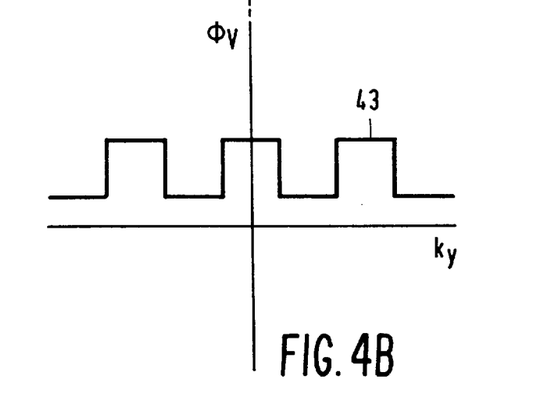
Figure 4C:
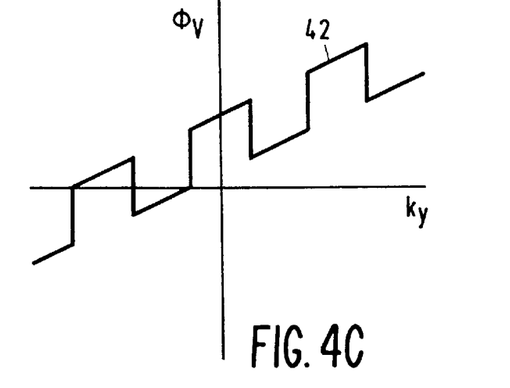

In order to counteract artefacts in an image reconstructed from the measured magnetic resonance signals generated by means of the above multi-shot EPI method, said artefacts being due to inhomogeneities in the static magnetic field, a method is used which is known inter alia from the cited Patent Application WO 95/01509. According to the method disclosed in the cited Patent Application, the time interval $\tau_2$ is varied between an initial read gradient and an alternating read gradient in successive EPI pulse sequences; it then holds that $\tau_2 = t_3 - t_2$ and that a first integral of the initial read gradient 230 over an interval which is equal to the pulse duration of the initial gradient is equal to substantially half a second integral of the alternating gradient 231 over an interval equal to the duration of a first lobe, the sign of the first integral opposing the sign of the second integral. FIG. 3 shows, by way of example, the time shifting of the known method. For the purpose of illustration FIG. 3 shows merely an initial read gradient 330 and subsequent alternating read gradients 331 of five successive EPI pulse sequences, the time interval $\tau_2$ being determined as $$\tau_2 = C + \frac{k_y}{\Delta k_y} \Delta t,$$

where C is a constant, $k_y$ is the actual value of the initial phase encoding of the magnetic resonance signal to be measured, and $\Delta k_y$ is the distance between adjacent lines in the k-space, and where $\Delta t = T/N$, in which T is the width of a lobe of the alternating read gradient and N is the number of repeats of the pulse sequence. FIG. 4 shows the distribution of phase errors across the k-space due to an inhomogeneity in the static magnetic field and the correction of the phase error according to the known method. The stepped line 40 represents the phase error in stationary tissue as a function of the $k_y$ value, without the correction, and the line 41 represents the phase error in the measured gradient echo signals due to excited spins in stationary tissue as a function of the $k_y$ value with the correction. The advantage of the correction consists in that the phase error is linearly distributed across the k-space and that after Fourier transformation ghost artefacts are suppressed in the image and only a distortion remains.

Figure 5:
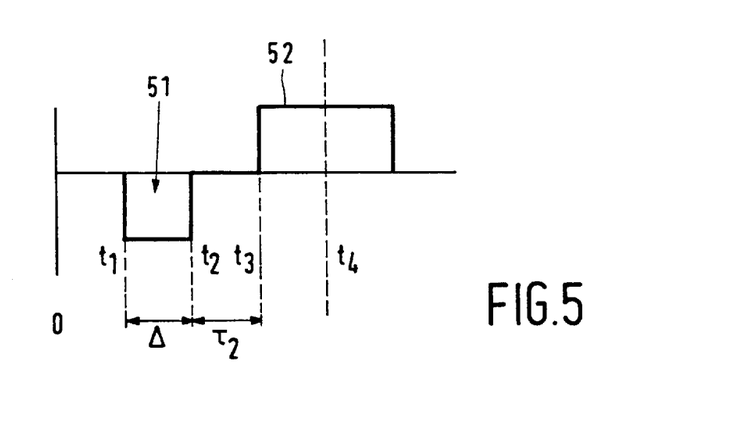
FIG. 5 shows an initial read gradient and a first lobe of an alternating read gradient.

During the imaging of, for example blood flows or CSF in a part of a body, artefacts may arise due to different first-order moments of the read gradient through the different time intervals $\tau_2$, so that different phase variations of the spins in the fluid flow occur as indicated by the inclined stepped line 42 in FIG. 4. The phase correction according to the invention, in which the first-order moment of the initial read gradient and the alternating read gradient is kept constant, is represented by the stepped line 43 in FIG. 4. It can be derived from FIG. 4 that the phase error in the vicinity of $k_y = 0$ is substantially constant. The phase variation of the spins due to the first-order moment of the read gradient will be elucidated with reference to FIG. 5. FIG. 5 shows an initial read gradient 51 and a read gradient 52. The net phase variation $\Phi_v$ due to the spins in a flow of velocity v in the direction of the read gradient is given by $$\Phi_v = \int_{t_1}^{t_2} \gamma(-G) v t \, dt + \int_{t_3}^{t_4} \gamma G v t \, dt,$$

where $t_2 = t_1 + \Delta$; $t_4 = t_3 + \Delta$ and $t_3 = t_2 + \tau_2$ and where $\gamma$ is the gyromagnetic constant, G is the strength of the gradient applied, and v is the velocity of the fluid flow in the direction of the gradient. It also holds that $\Phi_v = \gamma G \Delta (\Delta + \tau_2) v$. However, because the time interval $\tau_2$ is different for each successive EPI pulse sequence, different phase variations occur in gradient echo signals of the same sequence number which are generated in successive EPI pulse sequences. In order to render the phase error caused by flow of the spins independent of $k_y$ in the vicinity of $k_y = 0$, in the method according to the invention the first-order moment of the initial read gradient and the alternating read gradient are kept constant in each EPI sequence by keeping the time interval $\tau_2$ constant and by varying the time interval $\tau_1$ between the excitation RF pulse and the initial read gradient in successive EPI pulse sequences, the time interval $\tau_1$ being determined by $$\tau_1 = C + \frac{k_y}{\Delta k_y} \Delta t,$$

where C is a constant, $k_y$ is the actual value of the initial phase encoding of the magnetic resonance signal to be measured, and $\Delta k_y$ is the distance between adjacent lines in the k-space, and where $\Delta t = T/N$, in which T is the width of a lobe of the alternating read gradient and N is the number of repeats of the pulse sequence.

Figure 6:
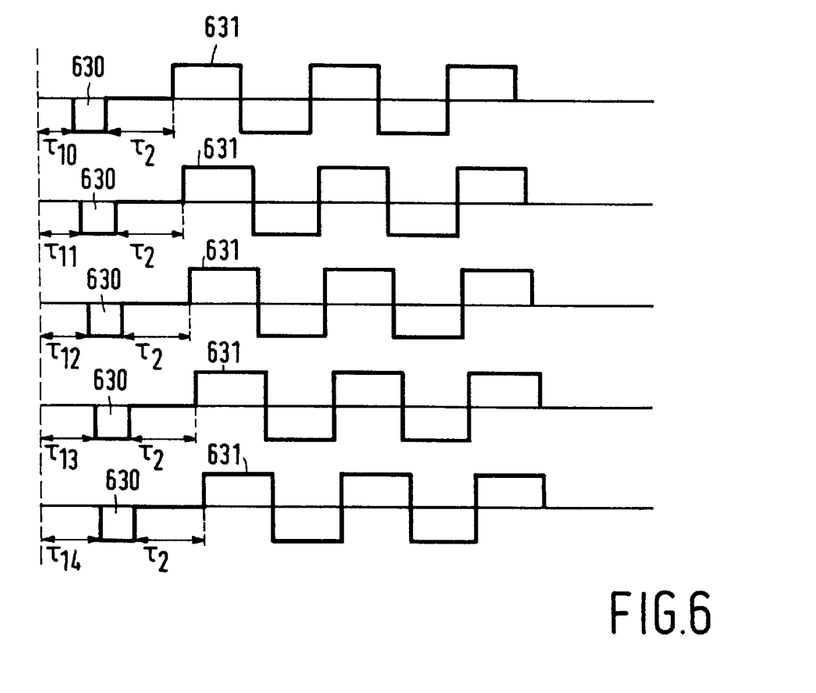
FIG. 6 shows the time shifting according to the invention in a multiple EPI pulse sequence.

FIG. 6 shows an example of five successive EPI pulse sequences according to the invention, only their initial read gradient 630 and alternating read gradients 631 being shown; the first-order moment of the read gradient is kept substantially constant by varying the time interval $\tau_1(n)$ with respect to the time interval $\tau_1(n-1)$ of the preceding EPI pulse sequence in conformity with said formule and by keeping constant the time interval $\tau_2$ between the initial read gradient 630 and the alternating read gradient 631. The net phase variation of the spins due to flow is then constant for all successive EPI pulse sequences. Furthermore, when the read gradient is shifted, the initial phase encoding gradient and the phase encoding pulses are also shifted.

Figure 7:
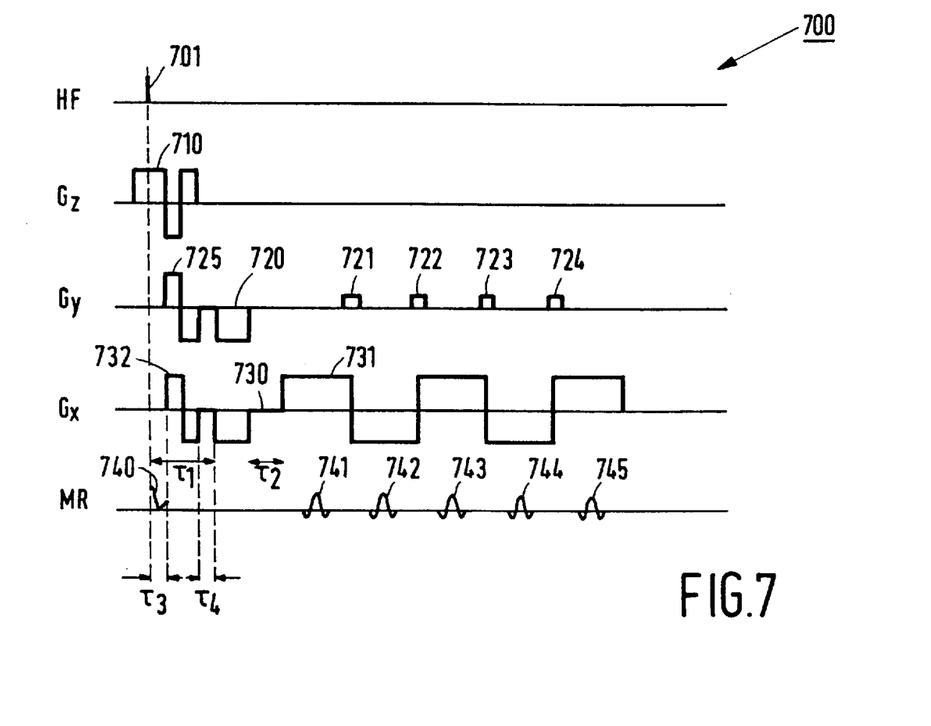
FIG. 7 shows an EPI pulse sequence with time shifting according to the invention, utilizing a bipolar gradient pair for the initial read gradient and the alternating read gradient.
Figure 8:
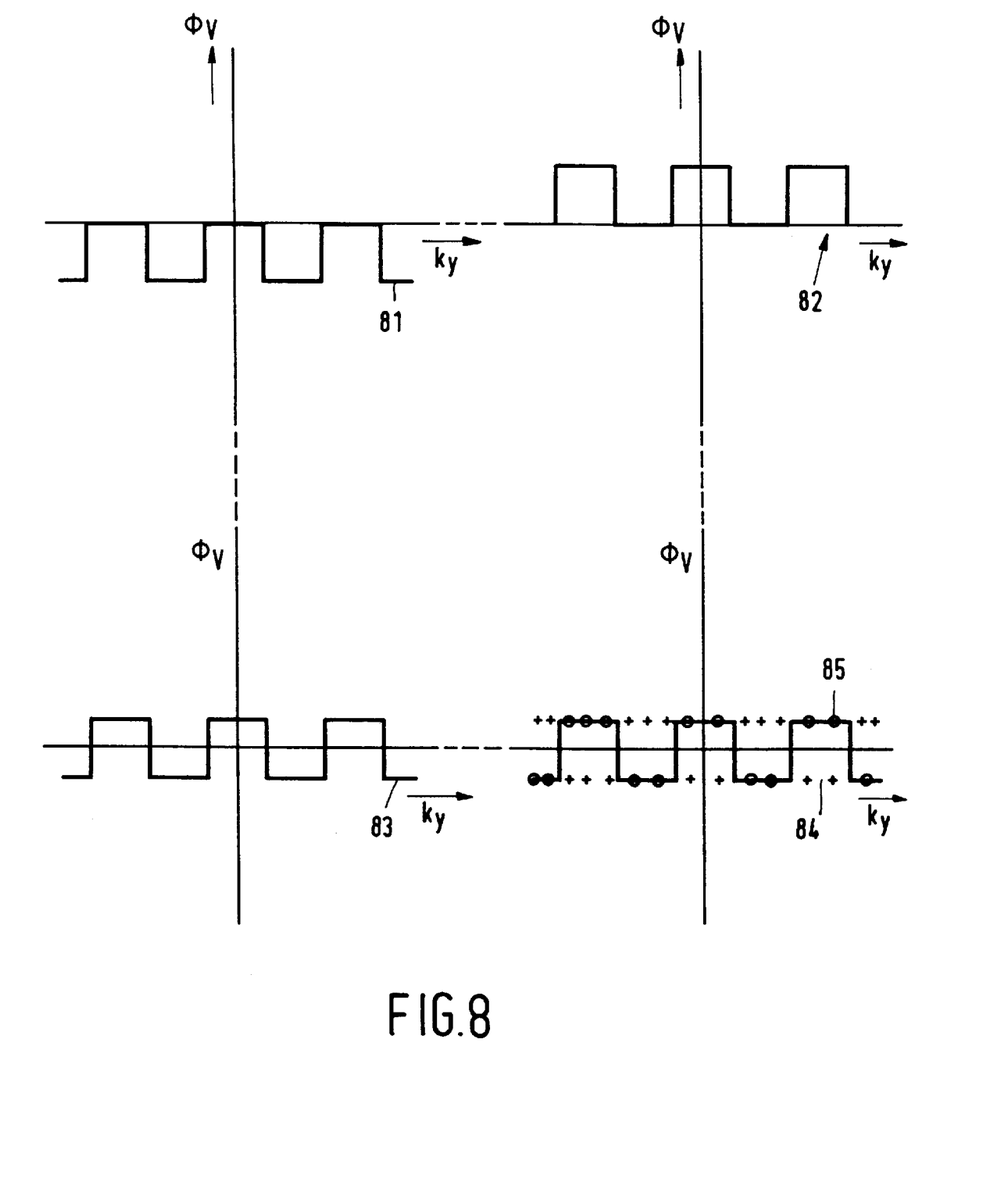
FIG. 8 shows the adjustment of the phase error by flow compensation.

A bipolar gradient pair can also be used to counteract further ghost artefacts in images of blood flows or CSF in a part of the body. In an EPI sequence including an echo pulse train of five gradient echo signals, first-order flow compensation is thus achieved, for example for the first gradient echo signal, the third gradient echo signal and the fifth gradient echo signal. FIG. 7 shows an EPI pulse sequence 700 in which a bipolar gradient pair 732 has been added prior to the initial read gradient 730 and the alternating read gradient 731. There are two possibilities for which the bipolar gradient pair 732 can be utilized. According to a first possibility, which is preferably used, a time interval $\tau_3$ between the excitation RF pulse 701 and the bipolar gradient pair 732 is kept constant and a time interval $\tau_4$ between the bipolar gradient pair 732 and the initial read gradient 730 is varied. According to a further possibility, which is more difficult to implement in practice, the time interval $\tau_3$ is varied and the time interval $\tau_4$ is kept constant; the duration of the time interval $\tau_4$ may then also be zero. In both possibilities the first-order moment of the read gradient is not influenced by the time shift. It is thus achieved that a first-order flow compensation can be adjusted by means of the initial read gradient 730 and the first lobe of the alternating read gradient 731, the phase error due to the flow in the first gradient echo signal 741 of the echo pulse train then being substantially zero. Moreover, due to the lobes of the alternating read gradient 731, the first-order flow compensation also occurs for the third gradient echo signal 743 and the fifth gradient echo signal 745 of the echo pulse train. The adjustment of the phase error $\Phi_v$ by the bipolar gradient pair will be elucidated with reference to FIG. 8. FIG. 8 shows a first adjustment 81 of $\Phi_v$, where $\Phi_v$ is adjusted to a value which is substantially equal to zero for the positive lobes of the alternating read gradient. This possibility is used preferably during the execution of measurements of gradient echo signals where the measuring values which correspond to k-plane are measured only once, or during the execution of measurements of gradient echo signals where the signal values are measured several times with the same direction of the alternating read gradient. In that case flow compensation is achieved for the lines around $k_y=0$, which lines make the most important contribution to the reconstructed image of the measured signal values. Another possibility is the use of a second adjustment 82 of $\Phi_v$, a value substantially equal to zero then being adjusted for the negative lobes of the read gradient. Moreover, $\Phi_v$ can also be adjusted to a third value 83, the mean value of $\Phi_v$ for positive and negative lobes of the alternating read gradient then being adjusted to a value substantially equal to zero. The flow compensation results in a reduction of signal loss due to a difference in phase shift as caused by flow within a volume element, and in a reduction of the sensitivity of the phase of the gradient echo signals to time-dependent variations of the flow velocity.

A bipolar gradient pair can also be inserted between the initial phase encoding gradient 720 and the instant of the first gradient echo signal 741 in order to counteract shifting due to a fluid flow of blood or CSF in a part of the body which is oriented at an angle relative to the x-direction and the y-direction.

A further improvement is achieved by means of a method with flow compensation in which the magnetic resonance signals are measured twice (NSA=2) with an opposed read gradient for each measurement, the signal values measured being situated on the same or substantially the same lines in the k-space. For example, during a first measurement the signal values are measured along a line in the positive $k_y$-direction and during a second measurement they are measured along this line in the negative $k_x$-direction. To this end, for example, the initial read gradient and the read gradient in the EPI pulse sequences are inverted every other pulse sequence. This method can also be used for a singular EPI method, in which substantially all lines in the k-plane of the set are measured by means of a single excitation RF pulse. For a multi-shot EPI method, a pulse sequence of which is shown in FIG. 7 by way of example, this means that the directions of the initial read gradient 730 and the alternating read gradient 731 and the bipolar gradient pair 732 are inverted either in the even or in the odd pulse sequences. For technical reasons the sequence in practice is as follows: execution of all measurements with a first direction of the read gradient and subsequently the execution of all measurements with the direction of the read gradient opposing the first direction. Due to the addition of a bipolar gradient pair, a flow compensation is achieved during the execution of the measurements, so that a minimum phase error due to flow is obtained, the sign of the phase error changing as the sign of the read gradient changes, it being possible to adjust the mean value of the phase error $\Phi_v$ of the positive and the negative lobes of the read gradient 731 to substantially 0. After the measurements, two sets of measuring values are then available for reconstruction. Subsequently, during the reconstruction a first image is derived from the measuring values of the first and the second set, the phase error due to flow then being equal to $+\Phi_v$, and a second image is derived from the measuring values of the two sets, the phase error then being equal to $-\Phi_v$. In FIG. 8 the phase errors in the measuring values measured during the first measurement are denoted by the line 84, marked by "+", and the phase errors in the measuring values measured during the second measurement by the line 85, marked by "0".

Reconstruction yields two images, each having a constant but opposed phase error $\Phi_v$ due to the flow. Subsequently, a final image is derived from the two images. When the phase error due to flow is small, for example in the case of a flow velocity of less than 0.25 m per second, the images, or possibly the signal values, can be simply added for reconstruction. In the case of higher flow velocities, a simple addition will not yield the optimum result because the signals having a phase $+\Phi_v$ and $-\Phi_v$ will extinguish one another because the value of the phase errors $\Phi_v$ approaches $\pi/2$. In the case of higher flow velocities, therefore, the phase error is eliminated from both complex images by calculating, for example the modulus per pixel in the image or by performing a phase correction on the complex images which eliminates $\Phi_v$. Subsequently, the modulus images or the corrected images are added.

Another possibility for the elimination of the phase error $\Phi_v$ is the measurement of additional lines in the k-space. To this end, additional lines are inserted between the lines of the predetermined set and the read gradient is applied during the measurement of the gradient echo signals in such a manner that the direction thereof changes its sign per line. After reconstruction of the image from the signal values measured, a part of the image will be free from ghost artefacts because the situation of these ghost artefacts is outside the image.

Figure 9:
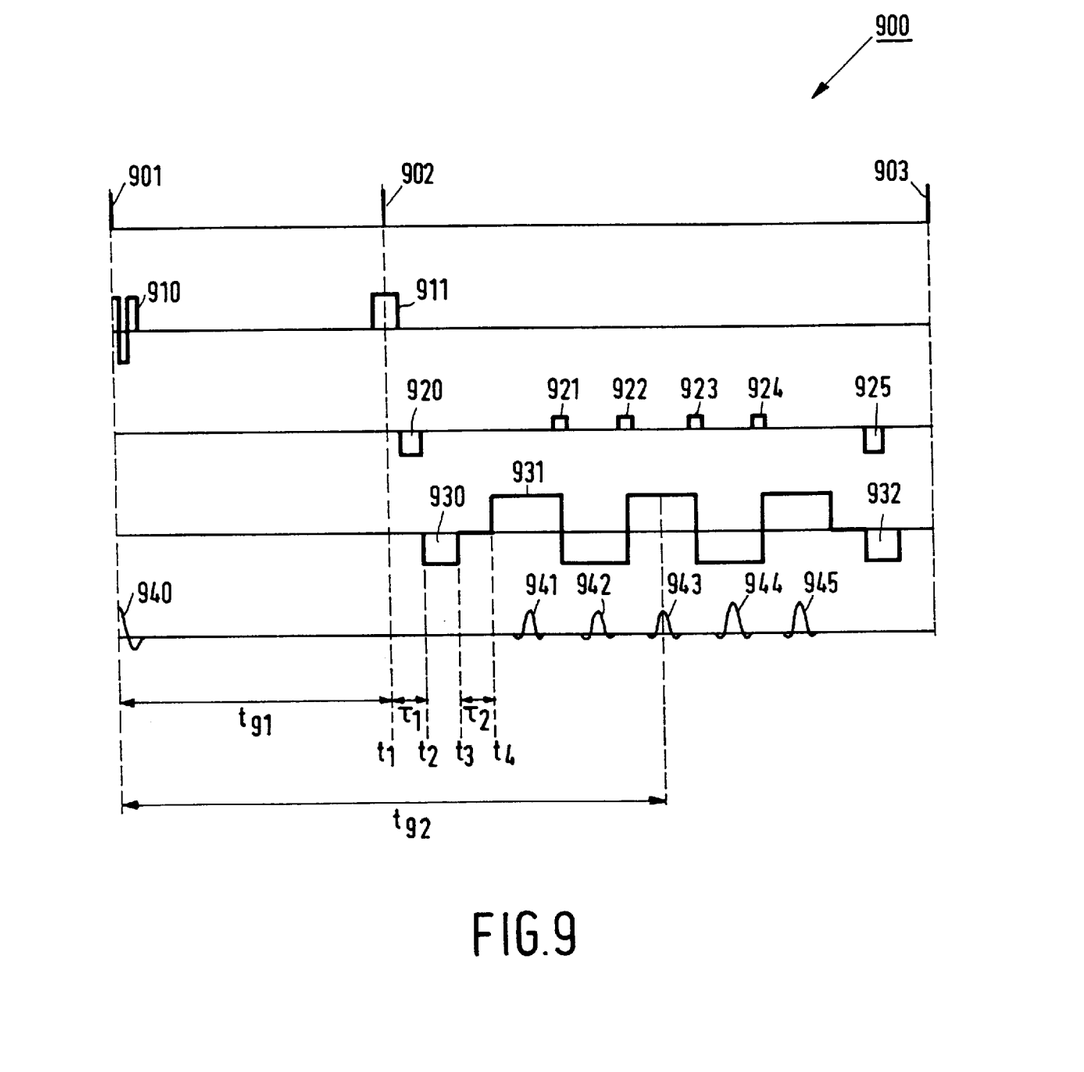
FIG. 9 shows a GRASE pulse sequence with a compensating read gradient and a compensating phase encoding gradient positioned so as to precede the second refocusing RF pulse.

The invention can also be used in, for example an EPI method which includes a refocusing RF pulse. It is also possible to use the invention in the case of a spin echo multi-echo EPI method in which several refocusing RF pulses are used but the phase encoding between two successive refocusing RF pulses is the same. Using the signal values measured, images having different $T_2$ contrasts can then be derived. Another possibility is to use a gradient and spin echo multi-echo method (GRASE) in which several refocusing RF pulses are used, different phase encoding being applied between successive refocusing RF pulses so that time is saved during the execution of measurements. FIG. 9 shows the use of the method in the known GRASE sequence which is used to generate the gradient echo signals 941, 942, 943, 944, 945 in an object or body so as to perform, for example a two-dimensional Fourier imaging technique. The GRASE pulse sequence 900 commences with an excitation RF pulse 901 with a flip angle α, followed after a period $t_1$ by a refocusing RF pulse 902 with a flip angle β. The flip angle α is, for example 90°. The flip angle β is, for example 180°. The excitation RF pulse 901 generates a first magnetic resonance signal 940. In FIG. 9 this signal is indicated in the row MR. The first magnetic resonance signal 940 quickly decays because of the dephasing of the individual spins due to local variations in the magnetic field. At the instant $t_{91}$ the excitation RF pulse 901 is succeeded by the refocusing RF pulse 902. The refocusing RF pulse 902 reverses the direction of the individual spins without disturbing the local magnetic field. As a result, dephasing is converted into rephasing so that, in the absence of temporary magnetic gradient fields, a spin echo signal arises after a period $t_{92}$, $t_{92}$ being $2t_{91}$. However, when an initial read gradient 930 is applied at the instant $t_1$ after the refocusing RF pulse 902, it also causes dephasing of the spins. At the instant $t_3$ an alternating read gradient 231 is applied, the gradient being oriented alternately in the positive and in the negative direction. The first lobe of the alternating read gradient 931 causes rephasing, so that a gradient echo signal 941 arises at the instant $t_4$. Each subsequent lobe causes a further gradient echo signal, thus giving rise to a series of gradient echo signals 941, 942, 943, 944, 945. During application of the initial read gradient 930 an initial phase encoding gradient 920 is also applied. Upon reversal of the polarity of the read gradient, furthermore, there is applied a phase encoding gradient pulse (blip) 221, 222, 223, 224, with the result that the measured signal values of the gradient echo signals 941, 942, 943, 944, 945 correspond to lines which are regularly distributed in the k-space and extend parallel to the $k_x$-axis, after each phase encoding gradient pulse there being generated a gradient echo signal whose measured signal values correspond to a next line.

In order to sample all or substantially all lines of a set of lines in the k-space, if necessary successive GRASE pulse sequences are generated, the initial phase encoding gradients then having different values, thus ensuring that prior to a subsequent refocusing RF pulse 903 the phase is returned to a fixed point again, for example the origin, of the k-space by a first compensating pulse 932 for compensating the initial read gradient 930 and a second compensating pulse 925 for compensating the initial phase encoding gradient 920 and the phase encoding gradient pulses 921, 922, 923, 924. In that case the part of the pulse sequence between the two refocusing RF pulses 902, 903 is repeated a sufficient number of times.

In order to render the phase error due to flow independent of $k_y$ in the vicinity of $k_y=0$, in the method according to the invention the first-order moment of the read gradient is kept constant in each GRASE echo sequence by keeping the time interval $\tau_2=t_3-t_2$ constant in the GRASE pulse sequence 900. In order to linearize the phase error in the k-space due to inhomogeneities in the static magnetic field, the time interval $\tau_1$ from the excitation RF pulse until the dephasing read gradient is varied in successive EPI pulse sequences, governed by $$\tau_1 = C + \frac{k_y}{\Delta k_y} \Delta t,$$

where $k_y$ is the actual value of the initial phase encoding of the magnetic resonance signal to be measured and $\Delta k_y$ is the distance between adjacent lines in the k-space, where $\Delta t=T/N$, in which T is the width of a lobe and N equals the total number of alternating read gradients to be applied after refocusing RF pulses during repeats of the GRASE pulse sequence. Other applications where the method according to the invention can be used are, for example phase-contrast angiography and flow velocity measurements. The invention can also be combined with other known magnetic resonance imaging methods utilizing multi-shot EPI pulse sequences, for example three-dimensional scanning methods.

I claim:

1. A method of imaging a part of a body, arranged in a steady magnetic field, by means of magnetic resonance, in which method a measuring cycle is repeated at least twice, which measuring cycle includes:

a. generating an excitation RF pulse in order to excite spins in the part of the body, b. applying a read gradient, comprising an initial read gradient and an alternating read gradient, to the steady magnetic field and sampling magnetic resonance signals, the read gradient and the application of further gradients providing sampling at instants which correspond to points of lines in a k-space which form part of a predetermined set of lines in the k-space, the gradients being applied differently per measuring cycle so that the magnetic resonance signals are sampled on substantially all lines of the set, characterized in that per measuring cycle a time interval between the excitation RF pulse and the initial read gradient is varied and that per measuring cycle a first-order moment of the initial read gradient and a first lobe of the alternating read gradient is kept substantially constant.

2. A method as claimed in claim 1, characterized in that the alternating read gradient is alternating in a positive and a negative direction, a first integral of the initial read gradient over an interval equal to the duration of the initial read gradient being equal to substantially half a second integral of the alternating read gradient over an interval equal to the duration of a first lobe of the alternating read gradient, the sign of the first integral opposing the sign of the second integral and the period of time between the initial read gradient and the center of the first lobe of the alternating read gradient being kept constant.

3. A method as claimed in claim 2, characterized in that subsequent to the excitation RF pulse and prior to the application of the read gradient there is generated a bipolar gradient pair whose direction extends parallel to the read gradient.

4. A method as claimed in claim 3, characterized in that subsequent to the excitation RF pulse and prior to the application of an initial phase encoding gradient, having a direction extending transversely of the read gradient, there is generated a bipolar gradient pair whose direction extends parallel to the initial phase encoding gradient.

5. A method as claimed in claims 4, characterized in that subsequent to the excitation RF pulse there is generated at least one refocusing RF pulse, after which the read gradient is applied and the signal values are measured.

6. A method as claimed in claims 3, characterized in that subsequent to the excitation RF pulse there is generated at least one refocusing RF pulse, after which the read gradient is applied and the signal values are measured.

7. A method as claimed in claim 2, characterized in that subsequent to the excitation RF pulse and prior to the application of an initial phase encoding gradient, having a direction extending transversely of the read gradient, there is generated a bipolar gradient pair whose direction extends parallel to the initial phase encoding gradient.

8. A method as claimed in claims 7, characterized in that subsequent to the excitation RF pulse there is generated at least one refocusing RF pulse, after which the read gradient is applied and the signal values are measured.

9. A method as claimed in claims 2, characterized in that subsequent to the excitation RF pulse there is generated at least one refocusing RF pulse, after which the read gradient is applied and the signal values are measured.

10. A method as claimed in claim 2, characterized in that the same points of the k-space are measured twice, using an opposed read gradient, after which an image is derived from signal values measured.

11. A method as claimed in claim 1, characterized in that subsequent to the excitation RF pulse and prior to the application of an initial phase encoding gradient, having a direction extending transversely of the read gradient, there is generated a bipolar gradient pair whose direction extends parallel to the initial phase encoding gradient.

12. A method as claimed in claims 11, characterized in that subsequent to the excitation RF pulse there is generated at least one refocusing RF pulse, after which the read gradient is applied and the signal values are measured.

13. A method as claimed in claim 1, characterized in that subsequent to the excitation RF pulse there is generated at least one refocusing RF pulse, after which the read gradient is applied and the signal values are measured.

14. A method as claimed in claim 1, characterized in that the same points of the k-space are measured twice, using an opposed read gradient, after which an image is derived from signal values measured.

15. A method as claimed in claim 1, characterized in that additional lines are inserted between the lines of the predetermined set and that the read gradient is applied in such a manner that the sign of its direction is reversed every line.

16. A method of imaging a part of a body, arranged in a steady magnetic field, by means of magnetic resonance, in which method a measurement cycle is repeated at least twice, which measuring cycle includes:
   a. generating an excitation RF pulse in order to excite spins in the part of the body,
   b. applying a read gradient to the steady magnetic field and sampling magnetic resonance signals, the read gradient and the application of further gradients providing sampling at instants which correspond to points of lines in a k-space which form part of a predetermined set of lines in the k-space, the gradients being applied differently per measuring cycle so that the magnetic resonance signals are sampled on substantially all lines of the set,
characterized in that per measuring cycle a time interval between the excitation RF pulse and the read gradient is varied and that per measuring cycle a first-order moment of the read gradient is kept substantially constant, and in that subsequent to the excitation RF pulse and prior to the application of the read gradient there is generated a bipolar gradient pair whose direction extends parallel to the read gradient.

17. A method as claimed in claim 16, characterized in that subsequent to the excitation RF pulse and prior to the application of an initial phase encoding gradient, having a direction extending transversely of the read gradient, there is generated a bipolar gradient pair whose direction extends parallel to the initial phase encoding gradient.

18. A method as claimed in claims 17, characterized in that subsequent to the excitation RF pulse there is generated at least one refocusing RF pulse, after which the read gradient is applied and the signal values are measured.

19. A method as claimed in claims 16, characterized in that subsequent to the excitation RF pulse there is generated at least one refocusing RF pulse, after which the read gradient is applied and the signal values are measured.

20. A device for forming images of a part of a body which is arranged in a substantially uniform steady magnetic field, including means for sustaining the steady magnetic field, means for generating RF pulses, means for generating temporary magnetic gradient fields, a control unit for generating control signals for the means for generating the RF pulses and for the means for generating the temporary magnetic gradient fields, means for receiving and sampling the MR signals, and a processing unit for processing the sampled MR signals, the control unit being arranged to execute at least twice a measuring cycle which includes:
   a. generating an excitation RF pulse
   b. applying a read gradient, comprising an initial read gradient and an alternating read gradient, to the steady magnetic field and sampling signal values of the magnetic resonance signal to be generated, the read gradient and the application of further gradients providing sampling points which correspond to points of lines in a k-space which form part of a predetermined set of lines in the k-space, the gradients being applied differently per measuring cycle so that the magnetic resonance signals are sampled on substantially all lines of the set,
characterized in that the control unit is also arranged in such a manner that per measuring cycle a time interval between the excitation RF pulse and the initial read gradient is varied and that per measuring cycle a first-order moment of the initial read gradient and a first lobe of the alternative read gradient is kept substantially constant.

* * * * *